United States Patent
Ramaswamy et al.

(10) Patent No.: US 9,702,916 B2
(45) Date of Patent: Jul. 11, 2017

(54) SYSTEM AND METHOD FOR REDUCING FALSE POSITIVE DETECTION BETWEEN A HUMAN AND A MOVING IMPLEMENT IN A POWER TOOL

(71) Applicants: Robert Bosch Tool Corporation, Broadview, IL (US); Robert Bosch GmbH, Stuttgart (DE)

(72) Inventors: Bharadwaja Maharshi Ramaswamy, Bangalore (IN); Sai Yogesh Kumar Mangapuram, Bangalore (IN); Niranjan Sathyanarayanarao Krishnarao, Bangalore (IN); Vishwanatha Manevarthe Srikantiah, Bangalore (IN)

(73) Assignees: Robert Bosch Tool Corporation, Broadview, IL (US); Robert Bosch GmbH, Stuttgart (DE)

( * ) Notice: Subject to any disclaimer, the term of this patent is extended or adjusted under 35 U.S.C. 154(b) by 893 days.

(21) Appl. No.: 13/827,286

(22) Filed: Mar. 14, 2013

(65) Prior Publication Data

US 2014/0090860 A1    Apr. 3, 2014

(30) Foreign Application Priority Data

Sep. 28, 2012   (IN) .......................... 4067/CHE/2012

(51) Int. Cl.
| | |
|---|---|
| *G01R 29/26* | (2006.01) |
| *F16P 3/12* | (2006.01) |
| *B23D 59/00* | (2006.01) |
| *B23Q 17/24* | (2006.01) |
| *F16P 3/14* | (2006.01) |
| *B27G 19/02* | (2006.01) |

(Continued)

(52) U.S. Cl.
CPC .......... *G01R 29/26* (2013.01); *B23D 59/001* (2013.01); *B23Q 11/0082* (2013.01);
(Continued)

(58) Field of Classification Search
CPC   G01R 29/26; B23Q 11/0082; B23Q 17/2438; B23Q 11/0092; B23D 59/001;
(Continued)

(56) References Cited

U.S. PATENT DOCUMENTS

| | | | |
|---|---|---|---|
| 7,536,238 B2 * | 5/2009 | Gass .................... | B23D 59/001 144/383 |
| 7,739,934 B2 | 6/2010 | Tetelbaum et al. | |

(Continued)

FOREIGN PATENT DOCUMENTS

JP      2007068597 A    3/2007

OTHER PUBLICATIONS

International Search Report and Written Opinion corresponding to PCT Application No. PCT/IN2013/000587, mailed Mar. 6, 2014 (13 pages).

*Primary Examiner* — Hemant M Desai
*Assistant Examiner* — Mobeen Ahmed
(74) *Attorney, Agent, or Firm* — Maginot Moore & Beck LLP

(57) ABSTRACT

A method for detection of false positive condition that an object is in contact with an implement in a power tool includes sampling an electrical signal received from the implement, identifying in-phase and a quadrature components of the sampled electrical signal, identifying a magnitude of each of the samples with reference to the in-phase component and the quadrature component for the samples, detecting an object approaching the implement with reference to the plurality of samples, identifying a signal-to-noise ratio for the samples, and identifying a false positive condition for the detected object with reference to the identified signal-to-noise ratio for the identified samples.

3 Claims, 5 Drawing Sheets

(51) Int. Cl.
*H04B 17/336* (2015.01)
*B23Q 11/00* (2006.01)
*G01S 7/288* (2006.01)

(52) U.S. Cl.
CPC ............ *B23Q 17/2438* (2013.01); *F16P 3/12* (2013.01); *B23Q 11/0092* (2013.01); *B27G 19/02* (2013.01); *F16P 3/148* (2013.01); *G01S 2007/2886* (2013.01); *H04B 17/336* (2015.01); *Y10T 83/091* (2015.04); *Y10T 83/178* (2015.04)

(58) Field of Classification Search
CPC .. F16P 3/12; F16P 3/148; B27G 19/02; Y10T 83/091; Y10T 83/178; G01S 2007/2886; H04B 17/336
See application file for complete search history.

(56) References Cited

U.S. PATENT DOCUMENTS

| | | | |
|---|---|---|---|
| 7,888,826 B1* | 2/2011 | Shafer | B23D 59/001 307/326 |
| 2005/0024257 A1 | 2/2005 | Britton et al. | |
| 2005/0268767 A1* | 12/2005 | Pierga | B23D 45/067 83/581 |
| 2006/0140314 A1 | 6/2006 | Kim et al. | |
| 2006/0247795 A1* | 11/2006 | Gass | B23D 59/001 700/1 |
| 2008/0025381 A1* | 1/2008 | Lee | H04B 1/30 375/219 |
| 2008/0089259 A1 | 4/2008 | Yang et al. | |
| 2009/0323766 A1* | 12/2009 | Wang | H04B 1/7075 375/130 |
| 2010/0059144 A1* | 3/2010 | Tetelbaum | B23D 59/001 144/356 |
| 2010/0206145 A1 | 8/2010 | Tetelbaum et al. | |
| 2011/0020084 A1* | 1/2011 | Brett | B23Q 15/013 408/1 R |
| 2014/0090530 A1* | 4/2014 | Haldar | G01R 19/0038 83/63 |
| 2014/0094955 A1* | 4/2014 | Ramaswamy | B27G 21/00 700/177 |

* cited by examiner

SYSTEM AND METHOD FOR REDUCING FALSE POSITIVE DETECTION BETWEEN A HUMAN AND A MOVING IMPLEMENT IN A POWER TOOL

CLAIM OF PRIORITY

This application claims priority to a pending Indian application with serial number 4067/CHE/2012, which is entitled "SYSTEM AND METHOD FOR REDUCING FALSE POSITIVE DETECTION BETWEEN A HUMAN AND A MOVING IMPLEMENT IN A POWER TOOL," and was filed on Sep. 28, 2012.

TECHNICAL FIELD

This disclosure relates generally to power tools, and, more specifically, to systems and methods for detecting contact between a human and a moving implement in a power tool.

BACKGROUND

Detection or sensing systems have been developed for use with various kinds of manufacturing equipment and power tools. Such detection systems are operable to trigger a reaction device by detecting or sensing the proximity or contact of some appendage of an operator with some part of the equipment. For example, existing capacitive contact sensing systems in table saws detect contact between the operator and the blade.

FIG. 1 depicts a prior art capacitive sensing based detection system 90 that is incorporated with a table saw 1. The detection system 90 drives an excitation voltage that is electrically coupled to a movable blade 22 of the saw 1, and detects the current drawn from the blade 22. The amplitude or phase of the detected current and/or excitation voltage changes when the blade 22 comes into contact with an electrically conductive object (such as an operator's hand, finger or other body part, as well as work pieces). The characteristics of the changes are used to trigger the operation of a reaction system 92. The reaction system 92 disables operation of the blade 22 by, for example, applying a brake to cease motion of the blade 22 and/or by dropping or otherwise removing the blade 22 from the cutting area. One example of a reaction system 92 uses an explosive charge to drive a stopper (not shown) into the blade 22 to arrest the motion of the blade 22. In addition, or instead, an embodiment of the reaction system 92 drops or collapses a blade support member (not show) to urge the blade 22 below the surface of the table 14.

The embodiment of the detection system 90 shown in FIG. 1 includes an oscillator 10 that generates a time-varying signal on line 12. The time-varying signal is any suitable signal type including, for example, a sine wave, a sum of multiple sine waves, a chirp waveform, a noise signal, etc. The frequency of the signal is chosen to enable a detection system to distinguish between contact with the first object, such as a finger or hand, and a second object, such as wood or other material, to be cut by the power tool. In the embodiment of FIG. 1, the frequency is 1.22 MHz, but other frequencies can also be used, as well as non-sinusoidal wave shapes. The oscillator 10 is referenced to the saw table 14 or other metallic structure as a local ground. As shown in FIG. 1, the blade 22 is disposed vertically in an opening defined by the saw table 14 (or work surface or cutting surface or platform).

The oscillator 10 is connected to two voltage amplifiers or buffers 16, 18 through the line 12. The first voltage amplifier 16 has an output connected to line 20, which operatively couples the output of the oscillator to the saw blade 22. A current sensor 24 operatively couples a signal from line 20 onto line 26 that is fed to an amplifier 28, which is connected to a processor 30 by line 32. The current sensor 24 is, for example, a current sense transformer, a current sense resistor, a Hall Effect current sense device, or other suitable type of current sensor. An output line 34 from the processor 30 is operatively connected to the reaction system 92 so that the processor 30 triggers the reaction system 92 if predetermined conditions are detected indicating, for example, contact between the blade 22 and the first object.

The signal on line 26 is indicative of the instantaneous current drawn by the blade 22. Because the saw blade 22 is in motion during operation of the table saw, the connection is made through an excitation plate 36, which is mounted generally parallel to the blade 22. The plate 36 is driven by the first voltage amplifier 16, and is configured with a capacitance of approximately 100 picoFarad (pF) relative to the blade 22 in the embodiment of FIG. 1. The plate 36 is held in a stable position relative to the side of the blade 22. The excitation plate 36 is configured to follow the blade 22 as the height and bevel angle of the blade 22 are adjusted during operation of the saw 1.

The capacitance between the first object and the saw table 14 (or power line ground if one is present) is in the range of approximately 30-50 pF in the embodiment of FIG. 1. When the capacitance between the excitation plate 36 and the saw blade 22 exceeds the capacitance between the first object and the saw table 14, the detection thresholds are not unduly affected by changes in the plate-to-blade capacitance. In the configuration of FIG. 1, the plate 36 is arranged in parallel with the blade 22 on the side where the blade 22 rests against the arbor 37, so that changes in blade thickness do not affect the clearance between the blade 22 and the plate 36. Other methods of excitation, including contact through the arbor bearings or brush contact with the shaft or the blade, could be used to the same effect.

In the detection system 90, the second-amplifier 18 is connected to a shield 38, and the amplifier 18 drives the shield 38 to the same potential as the excitation plate 36. Also, sensors in the detection system 90 optionally monitor the level of electrical current drawn by the shield 38. The shield 38 extends around the blade 22 underneath the table 14, and is spaced some distance away from the blade 22 on the top of the table 14 in the configuration of FIG. 1. The configuration of the shield 38 reduces the static capacitance between the blade 22 and the table 14, which acts as a ground plane if the table is not electrically connected to an earth ground. In various embodiments, the shield 38 is a continuous pocket of mesh, or some other type of guard that is electrically equivalent to a Faraday cage at the excitation frequencies generated by the oscillator 10. The shield 38 optionally includes a component that moves with the blade adjustments, or is large enough to accommodate the blade's adjustment as well as the various blades that fitted on the table saw. In the configuration of FIG. 1, the shield 38 moves with the blade adjustments, and includes a throat plate area of the table top 14.

The processor 30 performs various pre-processing steps and implements an adaptive trigger that enables detection of conditions indicative of contact between the first object and the blade 22. The processor 30 optionally includes one or more associated analog-to-digital (A/D) converters. The blade current signal from the current sensor 24 is directed to one or more of the A/D converters, which generate a corresponding digital signal. A blade voltage signal representing the voltage drop between the blade 22 and the excitation plate 36 is directed an A/D converter to generate a digital blade voltage signal in some embodiments. The processor 30 receives the digitized signal and performs various digital signal processing operations and/or computes derivative parameters based on the received signal. The processor 30 analyzes or otherwise performs operations on the conditioned blade signal to detect conditions indicative of contact between the first object and the blade 22.

Existing detection systems, such as the system 90 of FIG. 1, are susceptible to false positive detection events. A false positive detection event occurs when a detection system identifies that the first object, such as a human hand or other body part, is in contact with the blade 22 when, in fact, the first object is not in contact with the blade. Other false positives arise from the first object being an object that is intended for contact with the blade, such as a work piece, and a stop is implemented to prevent engagement between the blade and the work piece. False positive detection events can lead to a loss in productivity when the saw 1 ceases operation even if the first object is not in contact with the blade 22. Further, some embodiments of the reaction system 92, such as reaction systems that include explosive stoppers, are capable of damaging components in the saw 1 when activated. In light of these deficiencies, improvements to detection systems that reduce the occurrence of false positive detection events would be beneficial.

SUMMARY

In one embodiment, a method for detection of false positive condition that an object is in contact with an implement in a power tool has been developed. The method includes sampling an electrical signal received from the implement to generate a plurality of samples of the electrical signal, identifying an in-phase component and a quadrature component of each sample of the electrical signal, identifying a magnitude of each sample of the electrical signal with reference to the in-phase component and the quadrature component for each sample of the electrical signal, detecting an object approaching the implement with reference to the plurality of samples, identifying a signal-to-noise ratio for the electrical signal with reference to the identified magnitude for each of the plurality of samples of the electrical signal, and identifying a false positive condition for the detected object with reference to the identified signal-to-noise ratio for the plurality of samples of the electrical signal.

In another embodiment, a method for identifying a signal-to-noise ratio threshold for identifying a false positive condition has been developed. The method includes identifying a plurality of signal-to-noise ratios corresponding to a plurality of positive conditions, identifying a plurality of signal-to-noise ratios corresponding to a plurality of false positive conditions, and identifying a boundary between the plurality of signal-to-noise ratios corresponding to the plurality of positive conditions and the plurality of signal-to-noise ratios corresponding to the plurality of positive conditions.

In another embodiment, a power tool has been developed. The power tool includes an actuator configured to move an implement, a clock source configured to generate a time varying electrical signal that passes through the implement, and a controller operatively connected to the actuator and configured to sample the electrical signal. The controller is configured to activate the actuator to move the implement, sample the electrical signal received from the implement to generate a plurality of samples of the electrical signal, identify an in-phase component and a quadrature component of each sample of the electrical signal, identify a magnitude of each sample of the electrical signal with reference to the in-phase component and the quadrature component for each sample of the electrical signal, detect an object approaching the implement with reference to the plurality of samples, identify a signal-to-noise ratio for the electrical signal with reference to the identified magnitude for each of the plurality of samples of the electrical signal, and continue to enable the actuator to move the implement in response to identifying a false positive condition for the detected object with reference to the identified signal-to-noise ratio for the plurality of samples of the electrical signal.

DETAILED DESCRIPTION

For the purposes of promoting an understanding of the principles of the embodiments described herein, reference is now made to the drawings and descriptions in the following written specification. No limitation to the scope of the subject matter is intended by these references. This patent also encompasses any alterations and modifications to the illustrated embodiments as well as further applications of the principles of the described embodiments as would normally occur to one skilled in the art to which this document pertains.

As used herein, the term "power tool" refers to any tool with one or more moving parts that are moved by an actuator, such as an electric motor, an internal combustion engine, a hydraulic or pneumatic cylinder, and the like. For example, power tools include, but are not limited to, bevel saws, miter saws, table saws, circular saws, reciprocating saws, jig saws, band saws, cold saws, cutters, impact drives, angler grinders, drills, jointers, nail drivers, sanders, trimmers, and routers. As used herein, the term "implement" refers to a moving part of the power tool that is at least partially exposed during operation of the power tool. Examples of implements in power tools include, but are not limited to, rotating and reciprocating saw blades, drill bits, routing bits, grinding disks, grinding wheels, and the like. As described below, a sensing circuit integrated with a power tool is used to halt the movement of the implement to avoid contact between a human operator and the implement while the implement is moving.

Figure 1:
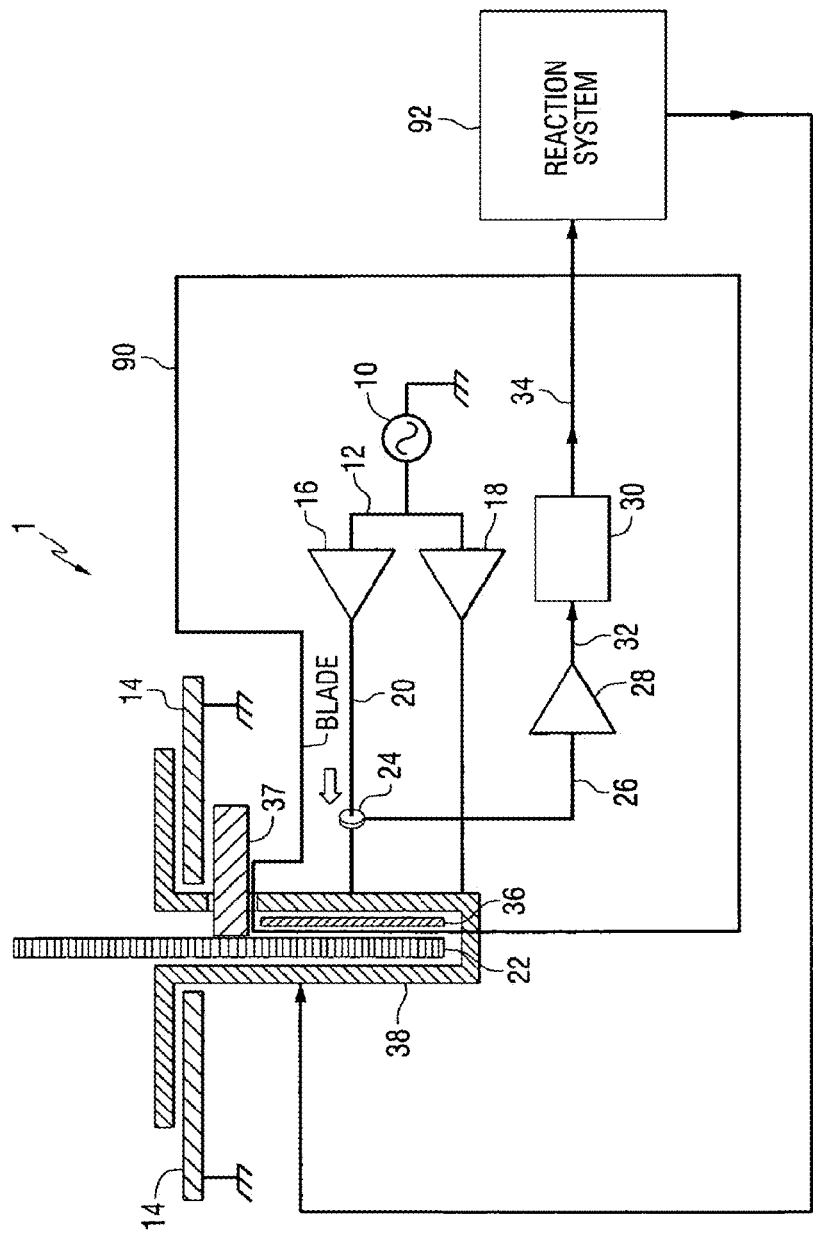
FIG. 1 is a diagram of a prior art table saw including a prior art detection system for detecting contact between a human and a saw blade.
Figure 2:
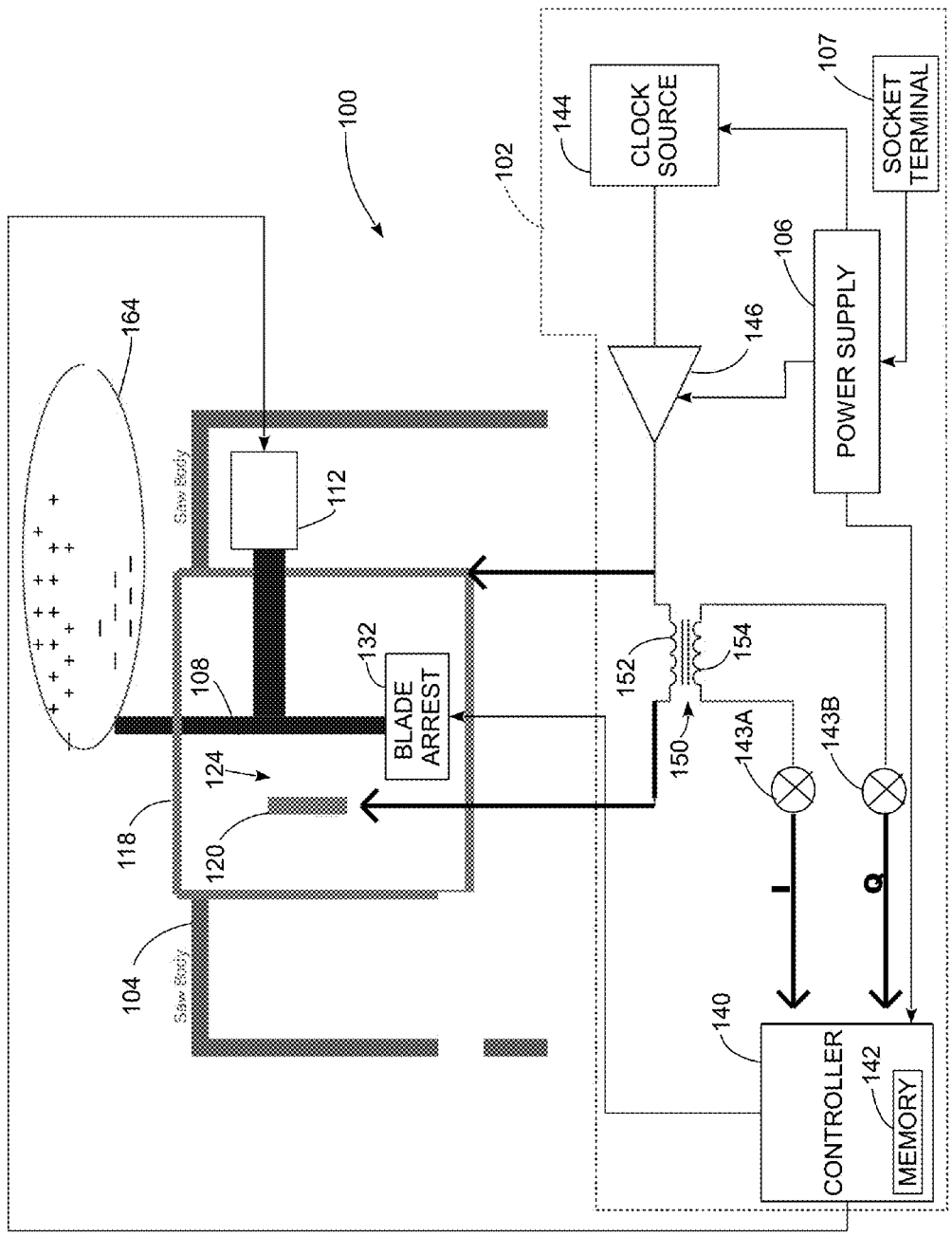
FIG. 2 is a block diagram of a table saw in which contact between the saw blade and different objects are identified with reference to a signal-to-noise ratio threshold to reduce or eliminate false positive identification of contact between the implement and a portion of a human body.

FIG. 2 depicts a table saw 100. The table saw 100 includes a table 104 through which a saw blade 108 extends for cutting work pieces, such as pieces of wood. The table saw 100 also includes an electric motor 112, a blade enclosure 118, and a blade arrest device 132. A plate 120 and the blade 108 form a capacitor 124 where a small air gap between the plate 120 and the blade 108 acts as a dielectric. In different embodiments, the plate 120 is or includes a capacitive, resistive, projective capacitive, optical, thermal, near infrared or other suitable sensing mechanism that either senses contact between the blade and an object or detects an object that approaches the blade 108. The blade enclosure 118 is electrically connected to the saw blade 108. The general configuration of the table 104, blade 108, and motor 112 are well known to the art for use in cutting work pieces and are not described in greater detail herein. Some components that are commonly used in table saws, such as guides for work pieces, blade height adjustment mechanisms, and blade guards are omitted from FIG. 2 for clarity.

The saw 100 includes a printed circuit card 102 to which a sensing circuit, which includes a clock source 144, driver amplifier 146, transformer 150 and a controller 140, are mounted. An electrical terminal socket 107, which is mounted on the printed circuit card 102 in FIG. 2 or otherwise electrically connected to the switched power supply 106 in another embodiment, receives an alternating current (AC) electrical power signal from an external power source, such as a generator or electrical utility provider. The switched power supply 106 converts the AC power signal from the external power source to a direct current (DC) electrical power signal at one or more voltage levels to supply power to the controller 140, clock source 144, and amplifier 146. The printed circuit card 102 and the components mounted on the printed circuit card 102 are electrically isolated from an earth ground. The power supply 106 serves as a local ground for the components mounted to the printed circuit card 102.

In the saw 100, the clock source 144 and driving amplifier 146 in the sensing circuit generate a time varying electrical signal that is directed through a primary winding 152 in the transformer 150, the plate 120, the blade 108, and the blade enclosure 118. The time varying electrical signal is referred to a "sensing current" because the controller 140 senses contact between the blade 108 and a portion of a human body with reference to changes in the magnitude of the sensing current. The time varying electrical signal is a complex valued signal that includes both an in-phase component and quadrature component. The sensing current passes through the primary winding 152 in the transformer 150 to the plate 120. The changes in the primary winding caused by discharges between the plate 120 and the blade 108 produce an excitation signal in the secondary winding 154 of the transformer 150. The excitation signal is another complex valued signal that corresponds to the sensing current passing through the primary winding 152.

The controller 140 in the sensing circuit is operatively connected to the motor 112, the secondary winding 154 in the transformer 150, a mechanical blade arresting device 132. The controller 140 includes one or more digital logic devices including general purpose central processing units (CPUs), microcontrollers, digital signal processors (DSPs), analog to digital converters (ADCs), field programmable gate arrays (FPGAs), application specific integrated circuits (ASICs) and any other digital logic devices that are suitable for operation of the saw 100. The controller 140 includes a memory 142 that stores programmed instructions for the operation of the controller 140.

During operation of the sensing circuit, the clock source 144 generates a time varying signal, such as sinusoidal waveform, at a predetermined frequency. In the embodiment of FIG. 2, the clock source 144 is configured to generate a signal at a frequency of 1.22 MHz, which is known to propagate through the human body. The amplifier 146 generates the sensing current as an amplified version of the signal from the clock source 144 with sufficient amplitude to drive the transformer 150 and capacitor 124 for detection by the controller 140.

During operation of the sensing circuit, the controller 140 receives the in-phase component I of the excitation signal in the secondary winding 154 through a first demodulator 143A and the quadrature component Q of the excitation signal through a second demodulator 143B. The transformer 150 isolates the sensing current flowing through the primary winding 152, plate 120, saw blade 108, and blade enclosure 118 from demodulators 143A and 143B that supply the in-phase and quadrature phase components of the signal, respectively, to the controller 140. Since the demodulators 143A and 143B generate electrical noise, the transformer 150 reduces or eliminates the effects of the noise on the primary winding 152 and sensing current. In one configuration, the transformer 150 is a 1:1 transformer where the primary winding 152 and secondary winding 154 have an equal number of turns. In alternative configurations, the ratio of windings in the primary winding 152 and secondary winding 154 are selected to either step-up or step-down the signal for demodulation and monitoring by the controller 140. The controller 140 includes one or more ADCs, filters, and other signal processing devices required to generate digital representations of the magnitude of the in-phase signal I and quadrature signal Q. The controller 140 identifies a magnitude of the sensing current A at a given time as a Pythagorean sum of the in-phase and quadrature components, as illustrated in the following equation: $A=\sqrt{I^2+Q^2}$. The controller 140 measures the demodulated signal at a predetermined frequency, such as a 100 KHz sampling rate, to identify changes in the magnitude A of the complex valued signal.

As the motor 112 rotates the blade 108, the rotating blade 108 comes into contact with different objects, including blocks of wood and other work pieces. A small portion of the charge that accumulates on the blade 108 flows into the work piece. The electrical conductivity of the wood work piece is, however, quite low, and the controller 140 in the sensing circuit continues to enable the motor 112 to rotate the saw blade 108. For example, when the blade 108 engages a block of wood, the controller 140 typically measures a small change in the sensing current A, but the change in the sensing current is identified as corresponding to wood or another material with low electrical conductivity.

While work pieces, such as wood, have low electrical conductivity, another object, such as a part of the human body, has a much higher electrical conductivity and absorbs a much greater portion of the charge on the blade 108 as the part approaches the blade 108. In FIG. 2 a portion of a human body 164, such as a hand, finger, or arm, is represented by a charge cloud indicating the flow of charge from the blade 108 to the human body. The controller 140 identifies imminent contact between the human body 164 and the blade 108 as a rapid change in the magnitude A of the sensing current at the time when the human body 164 nears the blade 108. In response to the rapid change in the magnitude of the sensing signal, the controller 140 deactivates the motor 112, engages the blade arrest device 132 to halt the motion of the blade 108, and optionally retracts the blade 108 before the blade contacts the human body 164.

In the configuration of FIG. 2, the saw blade 108 is a circular saw blade with a plurality of teeth arranged around the circumference of the blade. The teeth engage work pieces to cut the work pieces during normal operation of the saw. The teeth in the blade 108 also accumulate electrical charge from the sensing current. The teeth on the saw blade facilitate discharge of the electrical charge accumulated on the saw blade 108 to the human body 164 as the human body approaches the saw blade 108. In some configurations, an electrical arc between the human body 164 and the tips of the teeth in the saw blade 108 enables the charge accumulated on the blade 108 to flow into the human 164 prior to the human 164 actually contacting the blade 108. The arc distance is typically on the order of a few millimeters. The controller 140 identifies the change in the magnitude A of the sensing current and halts the blade 108 in response to discharge from the blade 108 due either to direct contact or close proximity between the human 164 and the blade 108.

In the configuration of FIG. 2, the human body has sufficient conductivity and capacity to draw charge from the blade 108 even when the printed circuit card 102 is isolated from earth ground and when the human body 164 is isolated from earth ground, such as when a human operator wears shoes with rubber soles. Thus, while the printed circuit card 102 and the human 164 do not share a common electrical ground, the controller 140 continues to identify contact between the human 164 and the blade 108 through identification of a rapid change in the identified sensing current amplitude A. While the absolute value of the amplitude A may vary during operation of the saw 100, the controller 140 can still identify contact with the human 164 in response to the magnitude and time of the change in the relative value of the amplitude A. During operation of the saw 100, the controller 140 is configured to identify contact with the human 164 and to deactivate the motor 112 and engage the blade arrest mechanism 132 to halt the saw blade 108 in a time period of approximately 1 millisecond.

In the saw 100, the controller 140 deactivates the electrical motor 112 in response to identification of contact between the blade 108 and a portion of a human. In the saw 100, the saw blade 108 generally continues rotating for a period of several seconds due to the momentum that the saw blade 108 accumulates during operation. The blade arrest device 132 is configured to either halt the saw blade 108 in a much shorter period of time, to drop the saw blade 108 below the table 104 to retract the saw blade 108 from contact with the human, or to both halt and retract the blade 108. In the saw 100, the blade arrest 132 includes a brake mechanism that halts the rotation of the blade 108. Additionally, the blade arrest 132 withdraws the blade 108 below the surface of the table 104. In other power tool embodiments, the moving implement halts in a short period of time after deactivation of an actuator without the requirement for an additional brake mechanism.

FIG. 2 depicts a table saw as an illustrative example of a power tool that uses a signal-to-noise ratio (SNR) threshold to help reduce false positive detections of human contact with the moving implement of the power tool. Alternative embodiments are envisioned that incorporate the sensing circuit of FIG. 2 into a wide range of power tools including, but not limited to, handheld electric drills, drill presses, handheld circular saws, reciprocating saws, band saws, routers, grinders, and any other power tool with a moving implement.

Figure 3:
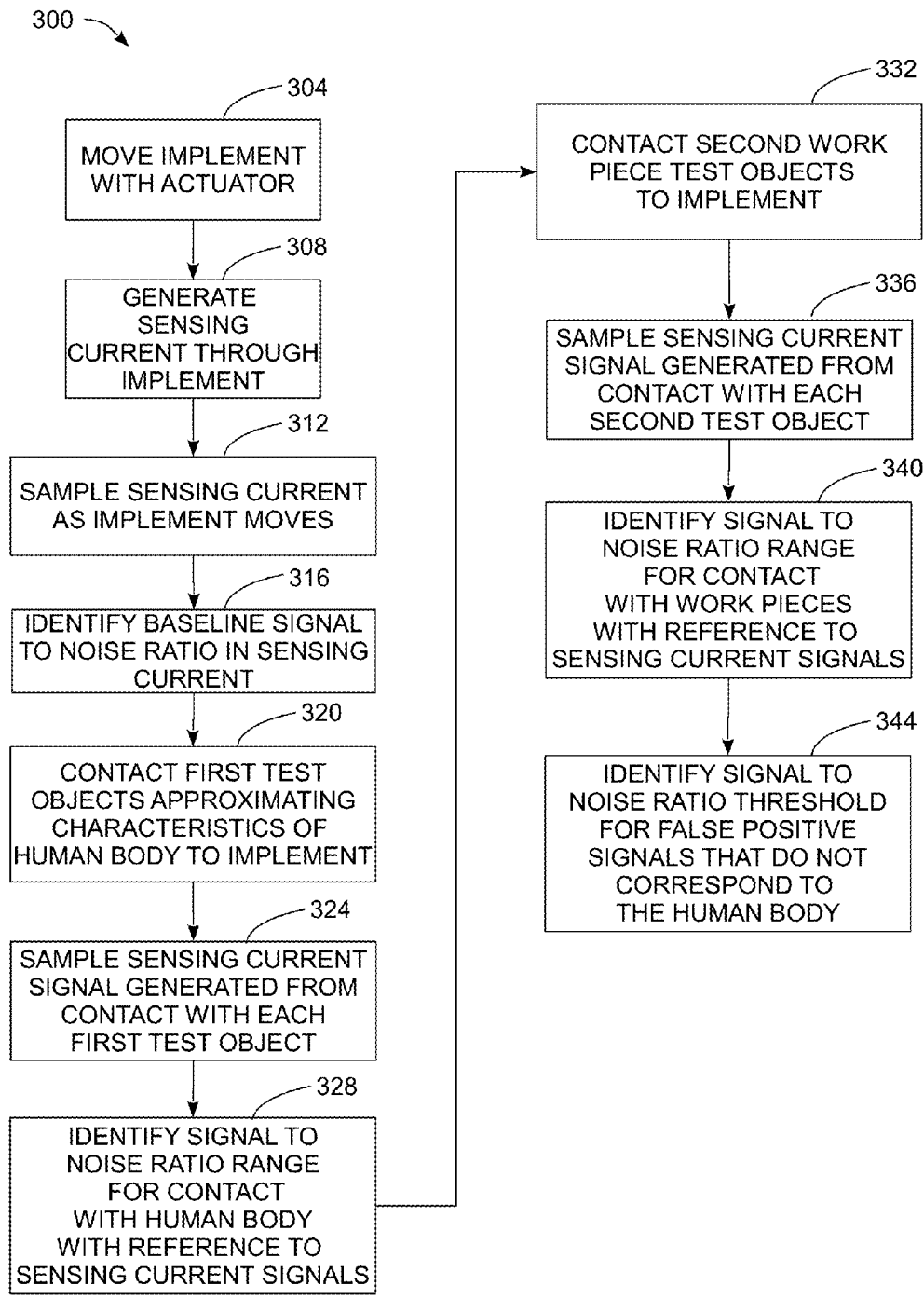
FIG. 3 is a flow diagram of a process for identifying a signal-to-noise ratio (SNR) threshold between signals generated when an implement in a power tool contacts a human and when the implement contacts a work piece.

FIG. 3 depicts a process 300 for characterizing signals generated from contact between an implement in a power tool and different objects to identify a SNR threshold to reduce or eliminate false positive identifications of contact between the implement and a portion of a human body. FIG. 3 is described in conjunction with the saw 100 of FIG. 2 for illustrative purposes. In the discussion below, a reference to the process 300 performing a function or action refers to one or more processors, such as the controller 140, executing programmed instructions stored in a memory to perform the function or action.

Process 300 begins as the power tool operates an actuator to move an implement (block 304). In saw 100, the electric motor 112 is the actuator and the saw blade 108 is the implement. The electric motor 112 is activated to rotate the saw blade 108 to cut work pieces, such as wood blocks. As the implement moves, the power tool generates the electrical signal as the electrical sensing current that is passed through the implement (block 308). As described above with reference to FIG. 2, the amplified time varying signal from the clock source 144 and amplifier 146 passes through the transformer 150 and the capacitor 124 formed from the plate 120 and the saw blade 108.

During process 300, the controller 140 samples the sensing current as the implement moves (block 312). In the saw 100, the controller 140 samples both the in-phase component I and quadrature component Q of the sensing current that is passed through the secondary winding 154 in the transformer 150. The sensing current passing through the primary winding 152 generates a corresponding excitation current in the secondary winding 154, and the demodulators 143A and 143B provide the in-phase component I and quadrature component Q of the sensing current, respectively, to the controller 140. The controller 140 includes any additional circuitry, such as filters and ADCs, to generate digital data corresponding to the in-phase and quadrature components of the sensing current. The controller 140 samples the sensing current over time at a predetermined sampling rate such as, for example, a 100 KHz sampling rate.

While sampling the electrical sensing signal, the controller 140 identifies a baseline signal-to-noise ratio (SNR) in the electrical sensing signal as the power tool moves the implement without contact between the implement and external objects such as work pieces (block 316). The mean expected value for the magnitude of the electrical sensing current signal A is the average identified current magnitude taken over a predetermined number of samples T:

$$A_{mean} = \frac{\sum_{t=0}^{T} A(t)}{T}.$$

The standard deviation of the T amplitude value samples is:

$$A_{stdev} = \sqrt{\frac{\sum_{t=0}^{T} (A_{mean} - A(t))^2}{T}}.$$

The baseline SNR for the magnitude of the sensing current is the ratio of the expected mean current level divided by the standard deviation from the mean current level:

$$SNR = \frac{A_{mean}}{A_{stdev}}.$$

Various sources of noise in the saw 100 generate deviations in the sampled current magnitude from the expected current magnitude value $A_{mean}$ even when no objects contact the implement. The numeric value of the SNR is typically expressed using the logarithmic decibel scale that is well known to the art. As described below, the signal in the sensing current generated due to contact between the implement and a work piece with low electrical conductivity, such as wood, generates a signal with a much lower SNR relative to the baseline SNR compared to a signal generated from an object that approximates the electrical conductivity of a portion of the human body.

During process 300, an operator moves a plurality of test objects into contact with the moving implement to enable the power tool to generate signals with the sensing current that characterize contact with different types of objects. In FIG. 3, the operator moves a first series of objects into contact with the implement that simulate the electrical characteristics of the human body (block 320). Objects with a water and electrolyte content that approximate the composition and electrical conductivity of the human body are moved into contact with the implement. One example of an object that is known to the art for simulating a portion of the human body is a hot dog, such as hot dogs that are sold commercially at grocery stores and other food retailers. Other examples of objects suitable for simulating the human body include various cuts of meat or sponges that are soaked with an electrolyte mixture.

As each of the first objects contacts the implement, the controller samples the sensing current to identify changes in the current magnitude A of the sensing current at predetermined times when each of the first objects contact the implement (block 324). In the saw 100, the controller 140 samples the sensing signal to identify a transient spike that occurs within a short period of time following the contact between the first object and the saw blade 108. The spike is typically generated within one millisecond after the contact between the object and the saw blade 108.

The controller 328 identifies the SNR of the transient signal with reference to the baseline SNR and the magnitude of the spike generated in the sensing current (block 328). In the saw 100, the controller 140 stores the identified SNR data in the memory 142 for each signal generated by a series of objects that approximate the characteristics of the human body to identify a range of expected SNR values for signals generated when a portion of the human body contacts the blade 108.

Process 300 continues as a second series of test objects that are work pieces are moved into contact with the implement (block 332). For example, in the saw 100 work pieces, such as pieces of wood that the saw 100 is configured to cut during normal operation, are moved into contact with the blade 108 in the same manner as they are during normal use of the saw 100. The controller 140 samples the signal generated in the sensing current as each of the work pieces contacts the blade 108 (block 336), and the controller 140 identifies an SNR for each of the signals generated when a work piece contacts the blade 108 compared to the baseline SNR (block 340). Since the wood work pieces have a much lower electrical conductivity than the first series of objects that approximate portions of the human body, the relative SNRs for the signals generated during contact with the work pieces is lower on average than the SNRs for the signals generated during contact with the first series of objects.

Figure 5:
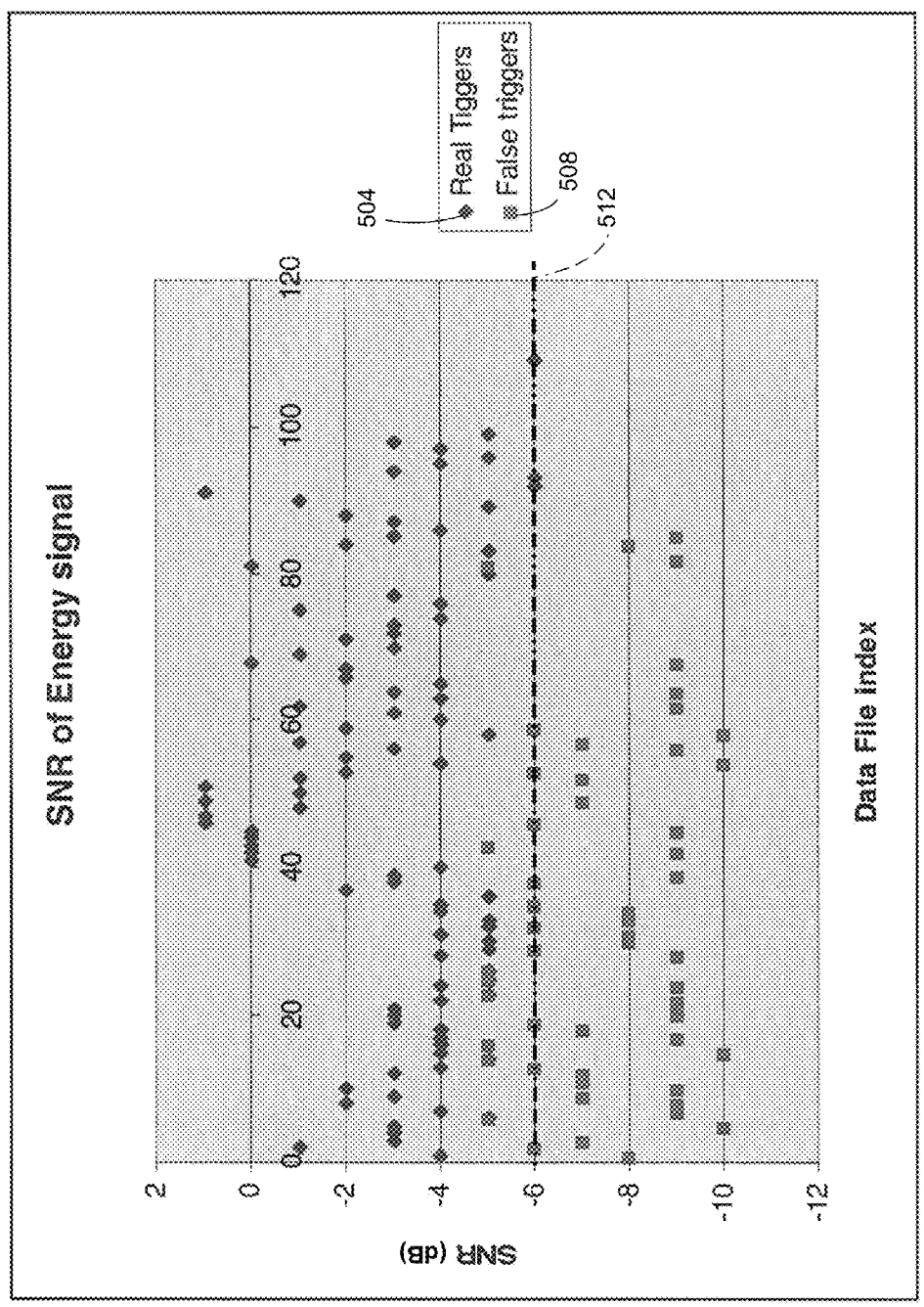
FIG. 5 is a graph depicting signal-to-noise ratios for different electrical signals corresponding to contact between an implement and an object with electrical properties that approximate a human and contact between the implement and work pieces.

Process 300 concludes with identification of an SNR threshold between the signals generated when the first series of objects contact the implement compared to the signals generated when second series of work pieces contact the implement (block 344). FIG. 5 depicts an exemplary graph of SNRs generated during process 300 using an embodiment of the saw 100 shown in FIG. 2. The first series of objects that simulate the human body are depicted as the "Real Triggers" data points 504 in the graph. The data points 504 have, on average, a higher SNR than the "False Triggers" data points 508 that correspond to signals generated when a work piece contacts the saw blade 108, or those signals arising from random electrical discharges from the saw blade 108. In the example of FIG. 5, all of the data points 504 have an SNR of at least −6 dB. While some of the data points 508 are at or above the −6 dB SNR level, process 300 identifies the −6 dB SNR level as the threshold 512 to ensure that all of the data points 504 are identified as actual contact between a portion of a human body and the implement during operation of the power tool. The −6 dB threshold 512 is a boundary that enables the power tool to identify signals with an SNR above the boundary as corresponding to contact between the implement and a human while signals with an SNR below the boundary are identified as false positive signals.

In the saw 100, the controller 140 stores the identified SNR threshold in the memory 142. As described below, the controller 140 uses the identified SNR threshold during operation to identify when to halt the blade 108 in response to contacting a portion of a human. In one configuration, process 300 is performed periodically to identify an SNR threshold for the saw 100 in different operating configurations and operating conditions. In another configuration, process 300 is performed at a factory or other facility to identify the SNR threshold for the saw 100. During manufacture, the SNR ratio is stored in the memory 142 for each of the saws 100, and the process 300 does not need to be performed by end users of the saws. While the embodiment of process 300 and the saw 100 described above depicts an identification of a −6 dB SNR threshold, the process 300 identifies a wide range of different SNR thresholds for different power tool embodiments.

Figure 4:
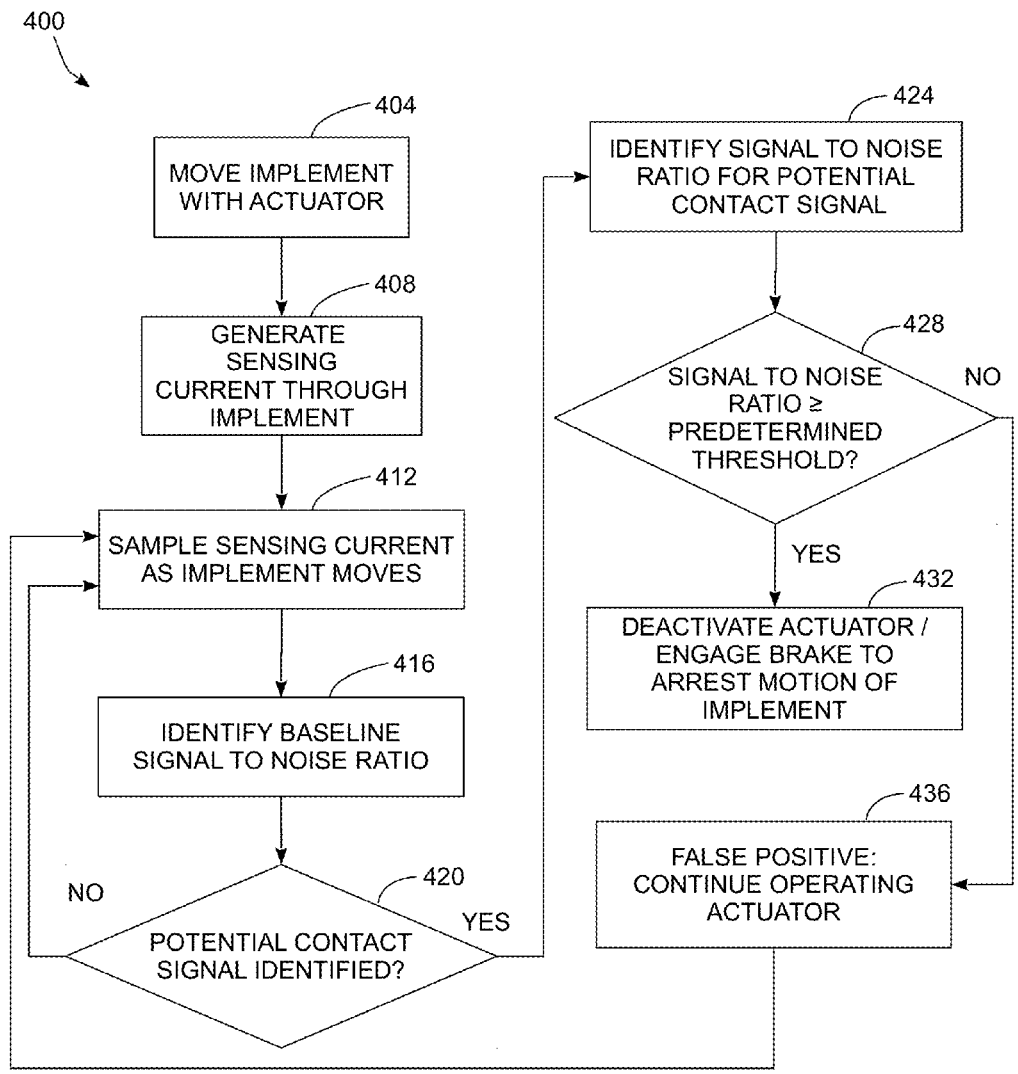
FIG. 4 is a flow diagram of a process for operating a tool with a predetermined SNR threshold to reduce or eliminate the identification of false positive signals as corresponding to contact between a portion of a human body and an implement in the power tool.

FIG. 4 depicts a process 400 for operation of a power tool using a predetermined SNR threshold to reduce or eliminate the identification of false positive signals as corresponding to contact between a portion of a human body and an implement in the power tool. FIG. 4 is described in conjunction with the saw 100 of FIG. 2 for illustrative purposes. In the discussion below, a reference to the process 400 performing a function or action refers to one or more processors, such as the controller 140, executing programmed instructions stored in a memory to operate components of the power tool to perform the function or action.

Process 400 begins as the power tool operates an actuator to move an implement (block 404). In saw 100, the electric motor 112 is the actuator and the saw blade 108 is the implement. The electric motor 112 is activated to rotate the saw blade 108 to cut work pieces, such as wood blocks. As the implement moves, the power tool generates the electrical signal as the sensing current that is passed through the implement (block 408). As described above with reference to FIG. 2, the amplified time varying electrical signal from the clock source 144 and amplifier 146 passes through the transformer 150 and the capacitor 124 formed from the capacitive coupling plate 120 and the saw blade 108. The sensing current generated in the saw 100 during process 400 has the same frequency, magnitude, and waveform as the sensing current generated in the saw 100 during process 300.

During process 400, the controller 140 samples the sensing current as the implement moves (block 412). The controller 140 samples the sensing current in the same manner as the processing described above with reference to block 312. The controller 140 identifies a baseline SNR in the sensing current using the samples in the same manner described above with reference to the processing of block 316 (block 416).

During process 400, the controller 140 continues to sample the sensing current until a potential contact signal is identified in the sensing current (block 420). As described above, if an object contacts the blade 108 then a portion of the accumulated charge on the blade 108 is transferred to the object, and a corresponding spike is generated in the magnitude A of the sensing current. In the saw 100, the controller 140 identifies the spike as a potential signal generated from contact between a portion of a human body and the saw blade 108. The signal spike, however, may also be generated by contact between a work piece and the saw blade 108, or by static discharge or other random electrical noise in the saw 100.

Process 400 continues as the controller 140 identifies the SNR of the identified potential contact signal in the current sensing signal (block 424). The controller 140 identifies the SNR of the spike identified in the sensing current with reference to the magnitude of the spike and baseline SNR identified for sensing signal through the saw blade 108. The controller 140 then compares the identified SNR to the SNR threshold value stored in the memory 142. If the identified SNR for the potential contact signal is less than the predetermined SNR threshold (block 428), then the controller 140 identifies the potential contact signal as a false positive and continues to operate the actuator to move the implement (block 436). For example, using the identified SNR threshold 512 of −6 dB depicted in FIG. 5, the controller 140 identifies a potential contact signal with an SNR of −9 dB as having an SNR that corresponds to contact between the saw blade 108 and a work piece or random noise instead of contact between a human operator and the saw blade 108. The controller 140 continues to sample the sensing current as the implement moves (block 412).

In process 400, if the identified SNR for the potential contact signal is greater than or equal to the predetermined SNR threshold (block 428), then the power tool deactivates the actuator that moves the implement and optionally engages a brake, retraction mechanism, or other device to halt the movement of the implement or withdraw the implement from contact with the human body (block 432). In the saw 100, the controller 140 deactivates the electric motor 112 and engages the blade arrest device 132 to halt the rotation of the saw blade 108 and retract the saw blade 108 below the surface of the table 104.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. A power tool comprising:
   an actuator configured to move an implement;
   a clock source configured to generate a time varying electrical signal that passes through the implement; and
   a controller operatively connected to the actuator and configured to sample the electrical signal, the controller being configured to:
   activate the actuator to move the implement;
   sample the electrical signal received from the implement to generate a plurality of samples of the electrical signal;
   identify an in-phase component and a quadrature component of each sample of the electrical signal;
   identify a magnitude of each sample of the electrical signal with reference to the in-phase component and the quadrature component for each sample of the electrical signal;
   detect an object approaching the implement with reference to a transient spike in the magnitude of at least one of the plurality of samples;
   identify a signal-to-noise ratio for the electrical signal with reference to the identified magnitude for each of the plurality of samples of the electrical signal;
   continue to enable the actuator to move the implement in response to the detection of the object approaching the implement and identifying a false positive condition for the detected object in response to the identified signal-to-noise ratio for the plurality of samples of the electrical signal being less than a threshold corresponding to signal-to-noise ratios for false positive conditions; and
   deactivate the actuator only in response to the detection of the object approaching the implement and to the identified signal-to-noise ratio for the plurality of samples of the electrical signal being greater than the threshold corresponding to signal-to-noise ratios for false positive conditions.

2. The power tool of claim 1, the controller being further configured to:
   identify a mean for the plurality of samples of the electrical signal with reference to the identified magnitude for each sample in the plurality of samples in the electrical signal;
   identify a standard deviation for the plurality of samples of the electrical signal with reference to the identified mean for the plurality of samples of the electrical signal and the identified magnitude for each sample in the plurality of samples in the electrical signal; and
   identify the signal-to-noise ratio as being the identified mean divided by the standard deviation.

3. The power tool of claim 1 wherein the predetermined threshold for the identified signal-to-noise ratio is −6 decibels (dB).

* * * * *